United States Patent
Kim et al.

(10) Patent No.: US 7,863,086 B2
(45) Date of Patent: Jan. 4, 2011

(54) THIN FILM TRANSISTOR SUBSTRATE AND METHOD FOR FABRICATING THE SAME

(75) Inventors: Bo-sung Kim, Seoul (KR); Soo-jin Kim, Suwon-si (KR); Young-min Kim, Yongin-si (KR); Keun-kyu Song, Yongin-si (KR); Yong-uk Lee, Seongnam-si (KR); Mun-pyo Hong, Seongnam-si (KR); Tae-young Choi, Seoul (KR); Joon-hak Oh, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/553,780

(22) Filed: Sep. 3, 2009

(65) Prior Publication Data

US 2009/0317942 A1    Dec. 24, 2009

Related U.S. Application Data

(62) Division of application No. 11/433,733, filed on May 12, 2006, now Pat. No. 7,605,395.

(30) Foreign Application Priority Data

Jul. 25, 2005    (KR) .......................... 2005-0067517

(51) Int. Cl.
H01L 51/40    (2006.01)
(52) U.S. Cl. .................. 438/99; 438/151; 438/591; 257/E21.411; 257/E51.006
(58) Field of Classification Search .................. 438/99, 438/151, 587, 591; 257/E21.411, E51.006
See application file for complete search history.

(56) References Cited

U.S. PATENT DOCUMENTS 6,166,785 A    12/2000    Ha (Continued)

FOREIGN PATENT DOCUMENTS

JP    2000269504 A    9/2000

(Continued)

OTHER PUBLICATIONS

"Silicong Processing for the VLSI Era: Deep Submicron Process Technology," Wolf, 2002, Lattice Press, vol. 4, p. 657.

Primary Examiner—Sue Purvis
Assistant Examiner—W. Wendy Kuo
(74) Attorney, Agent, or Firm—Cantor Colburn LLP

(57) ABSTRACT

A thin film transistor substrate includes an insulating substrate, a gate electrode formed on the insulating substrate, a first gate insulating film formed on the gate electrode and having an opening for exposing at least part of the gate electrode, a second gate insulating film covering the gate electrode exposed by the opening and having a larger dielectric constant than the first gate insulating film, a source electrode and a drain electrode disposed apart from each other in a central area of the second gate insulating film and defining a channel region there between, and an organic semiconductor layer formed in the channel region. A method for forming the TFT substrate is also provided. Thus, the present invention provides a TFT substrate in which a characteristic of a TFT is improved.

9 Claims, 10 Drawing Sheets

U.S. PATENT DOCUMENTS

| | | | |
|---|---|---|---|
| 6,770,904 B2 * | 8/2004 | Ong et al. | 257/40 |
| 6,821,811 B2 | 11/2004 | Hirakata et al. | |
| 6,912,024 B2 | 6/2005 | Kim et al. | |
| 7,125,742 B2 | 10/2006 | Hsieh et al. | |
| 2002/0140876 A1 | 10/2002 | Yoo et al. | |
| 2005/0012091 A1 | 1/2005 | Huang | |
| 2005/0045885 A1 * | 3/2005 | Kim et al. | 257/66 |
| 2006/0214312 A1 * | 9/2006 | Wu et al. | 257/787 |

FOREIGN PATENT DOCUMENTS

| | | |
|---|---|---|
| JP | 2003-086805 A | 3/2003 |
| JP | 2004152959 A | 5/2004 |
| JP | 2004-200304 A | 7/2004 |
| JP | 2004241397 A | 8/2004 |
| JP | 2004-304182 A | 10/2004 |
| KR | 1020040049110 | 6/2004 |
| KR | 1020050004565 A | 12/2005 |

* cited by examiner

THIN FILM TRANSISTOR SUBSTRATE AND METHOD FOR FABRICATING THE SAME

This application is a continuation application of U.S. application Ser. No. 11/433,733 filed May 12, 2006, which claims priority to Korean Patent Application No. 2005-0067517, filed on Jul. 25, 2005 and all the benefits accruing therefrom under 35 U.S.C. §119, and the contents of which in its entirety are herein incorporated by reference.

BACKGROUND OF THE INVENTION

1. Field of the Invention

The present invention relates to a thin film transistor ("TFT") substrate and a method for fabricating the same, and more particularly, to a TFT substrate and a method for fabricating the same in which an organic semiconductor layer is provided.

2. Description of the Related Art

A TFT substrate includes a TFT as a switching and driving device for controlling and driving an operation of each pixel, such as within a display panel of a display device. Each TFT includes a gate electrode, source and drain electrodes which are separated by the gate electrode so as to define a channel region, and a semiconductor layer. The semiconductor layer is formed of amorphous silicon ("a-Si") or polysilicon. However, an organic semiconductor has been recently substituted for the semiconductor layer.

Since the organic semiconductor can be formed at room temperature and atmospheric pressure, there is an advantage that it can reduce a fabricating cost and also be applied to a plastic substrate which is weak to heat. However, the organic semiconductor is disadvantageous in that it is weak in chemical resistance and plasma resistance.

In the organic TFT provided with the organic semiconductor as described above, an organic semiconductor material is applied to the channel region between the source and drain electrodes, and then patterned by a photolithographic process so as to form an organic semiconductor layer, whereby the organic TFT is fabricated.

However, this fabricating method is very complicated due to a large number of processes, and a characteristic of the organic semiconductor layer may be deteriorated by a chemical material, etc., which is used in forming source and drain electrodes, a data wire, a gate wire and so forth. Therefore, it is difficult to ensure stability and reliability in a characteristic of the organic TFT. Particularly, when the organic semiconductor material is applied and then patterned by the photolithographic process, as described in the conventional method, since the characteristic of the organic semiconductor layer is deteriorated, the characteristic of the organic TFT may be damaged.

BRIEF SUMMARY OF THE INVENTION

Accordingly, exemplary embodiments of the present invention provide a TFT substrate in which a characteristic of a TFT is improved.

Other exemplary embodiments of the present invention provide a method for fabricating a TFT substrate in which fabricating processes are improved.

The foregoing and/or other exemplary embodiments of the present invention can be achieved by providing a TFT substrate including an insulating substrate, a gate electrode formed on the insulating substrate. a first gate insulating film formed on the gate electrode and having an opening exposing at least part of the gate electrode, a second gate insulating film covering the gate electrode exposed by the opening and having a larger dielectric constant than the first gate insulating film, a source electrode and a drain electrode disposed apart from each other in a central area of the second gate insulating film and defining a channel region there between, and an organic semiconductor layer formed in the channel region.

According to an aspect of the present invention, the first gate insulating film has a dielectric constant in a range from 1 to 5.

According to an aspect of the present invention, the first gate insulating film includes at least one of acrylic-based resin, polystyrene-based resin, and benzocyclobutene having a low dielectric constant.

According to an aspect of the present invention, the second gate insulating film has a dielectric constant in a range from 4 to 15.

According to an aspect of the present invention, the second gate insulating film includes at least one of acrylic-based resin, polyvinyl phenolic-based resin, $SiN_x$, $SiO_x$, and fluoric-based polymer having a high dielectric constant.

According to an aspect of the present invention, the thin film transistor substrate further comprises a data wire formed between the insulating substrate and the gate electrode but not overlapped with the gate electrode, and an interlayer insulating film formed on the data wire and having a contact hole for exposing at least part of the data wire.

According to an aspect of the present invention, a conductive member is formed in the contact hole.

According to an aspect of the present invention, the conductive member is formed of a same material as the gate electrode.

According to an aspect of the present invention, the data wire includes a data line and a data pad.

According to an aspect of the present invention, the thin film transistor substrate further includes a gate pad formed at a same layer as the gate electrode on the interlayer insulating film, and an additional opening formed in the first gate insulating film exposing at least part of the gate pad.

According to an aspect of the present invention, the thin film transistor substrate further includes an additional opening formed in the first gate insulating film for exposing at least a part of the conductive member.

According to an aspect of the present invention, the data wire comprises a data line, and the source electrode is connected through the conductive member to the data line and the source electrode is at least partially contacted with the organic semiconductor layer.

According to an aspect of the present invention, the thin film transistor substrate further includes a gate line formed at a same layer as the gate electrode and insulatedly intersecting the data line to define a pixel region, wherein the drain electrode is at least partially contacted with the organic semiconductor layer and connected with a pixel electrode formed in the pixel region.

According to an aspect of the present invention, the first gate insulating film includes an additional opening, and the thin film transistor substrate further includes a gate pad formed at a same layer as the gate electrode on the interlayer insulating film, a data pad contacting member connected through the contact hole to the conductive member, and a gate pad contacting member connected through the additional opening to the gate pad.

According to an aspect of the present invention, the source electrode, the drain electrode, the data pad contacting member and the gate pad contacting member are formed of one of indium tin oxide ("ITO") and indium zinc oxide ("IZO").

According to an aspect of the present invention, the thin film transistor substrate further includes a first passivation layer formed in the channel region and on the organic semiconductor layer.

According to an aspect of the present invention, the thin film transistor substrate further includes a second passivation layer formed on the first passivation layer.

According to an aspect of the present invention, a height of the second gate insulating film is lower than a height of the first gate insulating film surrounding the second gate insulating film.

According to an aspect of the present invention, a height of the organic semiconductor layer is lower than a height of the first gate insulating film surrounding the organic semiconductor layer.

According to an aspect of the present invention, a height of the first passivation layer is lower than a height of the opening in the first gate insulating film surrounding the first passivation layer.

The foregoing and/or other aspects of the present invention can be achieved by providing a method for fabricating a thin film transistor substrate including preparing an insulating substrate, forming a gate electrode on the insulating substrate, forming a first gate insulating film, having a low dielectric constant, forming an opening in the first gate insulating film exposing at least part of the gate electrode, forming a second gate insulating film having a larger dielectric constant than the first gate insulating film in the opening, forming a source electrode and a drain electrode disposed apart from each other in a central area of the second gate insulating film to define a channel region there between, and forming an organic semiconductor layer in the channel region.

According to an aspect of the present invention, the method further includes forming a data wire between the insulating substrate and the gate electrode but not overlapped by the gate electrode, and forming an interlayer insulating film, having a contact hole for exposing at least part of the data wire, on the data wire and the insulating substrate.

According to an aspect of the present invention, forming the organic semiconductor layer includes employing an inkjet method.

According to an aspect of the present invention, the method further includes forming a conductive member in the contact hole when forming the gate electrode.

According to an aspect of the present invention, forming the second gate insulating film includes employing an inkjet method.

According to an aspect of the present invention, the method further includes forming a gate pad while forming the conductive member, forming an additional opening in the first gate insulating film, exposing at least part of the gate pad, and forming a data pad contacting member connected through the contact hole to the conductive member and a gate pad contacting member connected through the additional opening with the gate pad, while forming the source and drain electrodes.

According to an aspect of the present invention, the method further includes forming a first passivation layer in the channel region and on the organic semiconductor layer.

According to an aspect of the present invention, forming the first passivation layer includes employing an inkjet method.

The foregoing and/or other aspects of the present invention can be achieved by providing a method for fabricating a thin film transistor substrate including forming a gate electrode on an insulating substrate, forming a source electrode and a drain electrode disposed apart from each other to define a channel region over the gate electrode, and jetting an organic semiconductor material through a nozzle into the channel region and forming an organic semiconductor layer in the channel region.

According to an aspect of the present invention, the method also includes, prior to forming the source and drain electrodes, forming a first gate insulating film on the gate electrode, forming an opening in the first gate insulating film exposing the gate electrode, and forming a second gate insulating film on the gate electrode within the opening, wherein forming the source and drain electrodes includes forming the source and drain electrodes on the first gate insulating film and the second gate insulating film.

According to an aspect of the present invention, forming the second gate insulating film includes selecting a material for the second gate insulating film having a higher dielectric constant than a material used for forming the first gate insulating film.

According to an aspect of the present invention, forming the second gate insulating film includes forming the second gate insulating film with a smaller thickness than a thickness of the first gate insulating film.

According to an aspect of the present invention, forming the second gate insulating film includes jetting a gate insulating material into the opening.

According to an aspect of the present invention, the method further includes jetting a first passivation layer solution on the organic semiconductor layer.

BRIEF DESCRIPTION OF THE DRAWINGS

The above and/or other aspects, advantages, and exemplary embodiments of the prevent invention will become apparent and more readily appreciated from the following description of the exemplary embodiments, taken in conjunction with the accompanying drawings, in which.

DETAILED DESCRIPTION OF THE INVENTION

Figure 1:
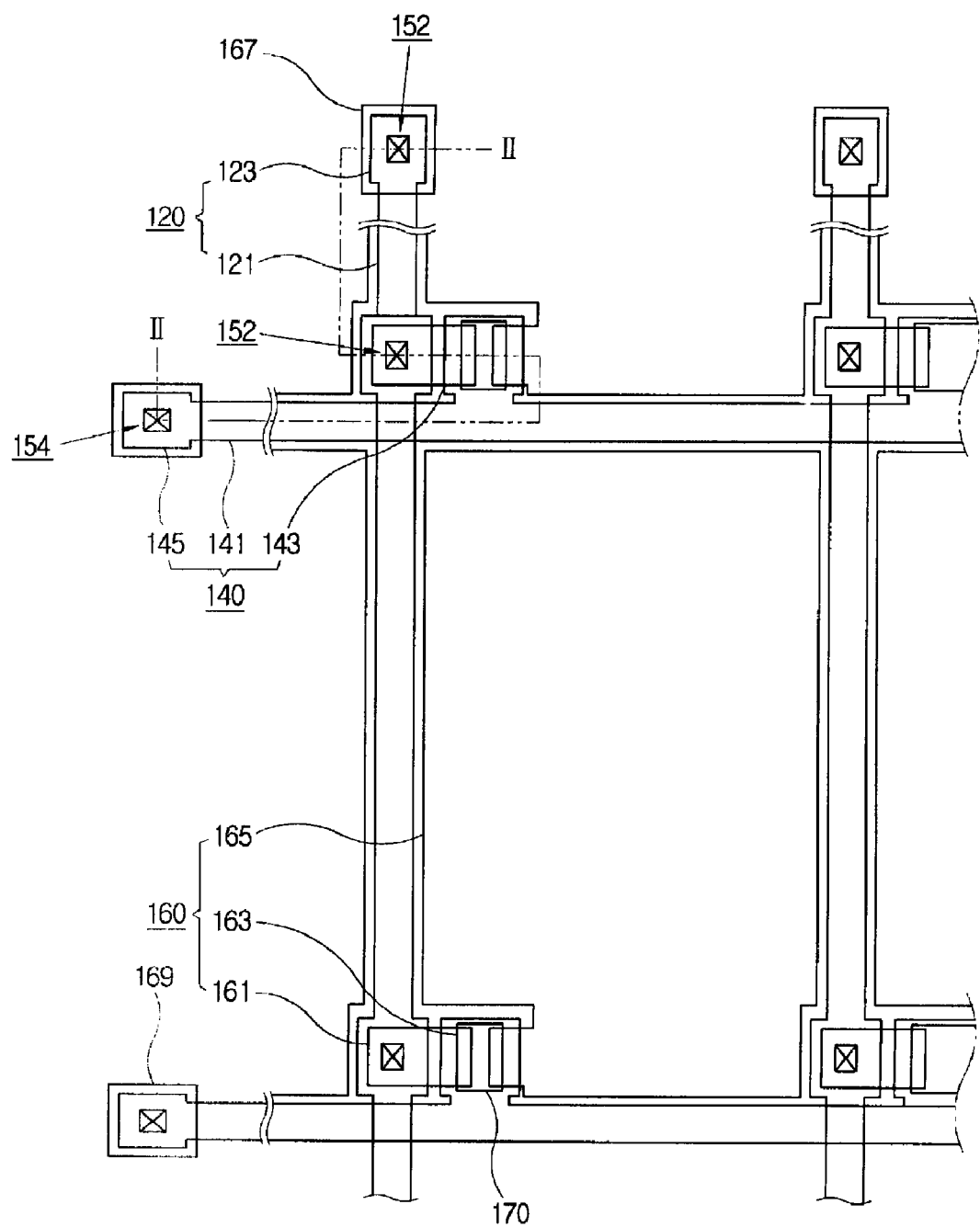
FIG. 1 is a plot plan view of an exemplary embodiment of a TFT substrate according to the present invention.

The invention will now be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout. In the drawings, the thickness and size of layers, films, and regions are exaggerated for clarity.

It will be understood that when an element is referred to as being "on" another element, it can be directly on the other element or intervening elements may be present there between. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, the present invention will be described in detail with reference to the accompanying drawings.

Figure 2:
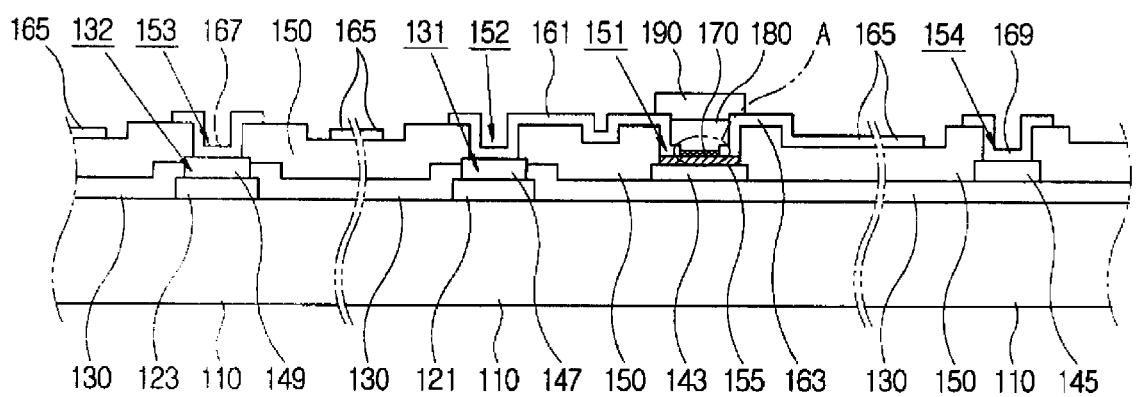
FIG. 2 is a cross-sectional view taken along line II-II of FIG. 1.

FIG. 1 is a plot plan view of an exemplary embodiment of a TFT substrate according to the present invention, and FIG. 2 is a cross-sectional view taken along line II-II of FIG. 1.

The TFT substrate shown in FIG. 1 includes an insulating substrate 110, a plurality of data wires 120 formed on the insulating substrate 110, an interlayer insulating film 130 formed on the data wires 120, a plurality of gate wires 140 formed on the interlayer insulating film 130, a first gate insulating film 150 formed on the gate wires 140 and having openings 151 for exposing at least a part of each of the gate wires 140, a second gate insulating film 155 formed at the openings 151, a transparent electrode layer 160 formed on the first gate insulating film 150, and an organic semiconductor layer 170 formed on the first gate insulating film 150 while being contacted with at least a part of the transparent electrode layer 160.

The insulating substrate 110 can be made of glass or plastic. When the insulating substrate 110 is formed of certain plastics, the insulating substrate 110 can provide flexibility to the TFT substrate. However, using an insulation substrate 110 made of flexible plastic may be weak to heat. When using an organic semiconductor layer, such as organic semiconductor layer 170 as will be further described below, since the semiconductor layer can be formed at room temperature and atmospheric pressure, it is facile to use the insulating substrate 110 made of a plastic material, wherein the plastic material includes, for example, polycarbon, polyimide, poly ether sulfone (PES), polyarylate (PAR), polyethylene naphthalate (PEN), polyethylene terephthalate (PET), etc.

The data wires 120 are formed on the insulating substrate 110. Each data wire 120 includes a data line 121 formed on the insulating substrate 110 so as to be extended in one direction, such as a first direction, and a data pad 123 formed at an end of the data line 121 to receive a driving or controlling signal from an exterior source. The data pad 123 receives a driving and controlling signal and transmits it to the data line 121. Each data wire 120 may be formed of at least one of Al, Cr, and Mo which have a low price and a good conductivity, or Au, Pt, Pd which have a relatively high price. Each data wire 120 may have a single layer or a plurality of layers containing at least one of the above-mentioned materials.

According to exemplary embodiments of the present invention, in order to protect the first gate insulating film 150 from a chemical material used in a data wire forming process thereby preventing a characteristic of the organic semiconductor layer 170 from being deteriorated, the data wire 120 is first formed on the insulating substrate 110, and then the interlayer insulating film 130 is formed on the data wire 120.

The interlayer insulating film 130, as shown in FIG. 2, covers the data wire 120 on the insulating substrate 110, and covers portions of the insulating substrate 110 not covered by the data wire 120. The interlayer insulating film 130 is formed of an inorganic material such as $SiN_x$ or $SiO_x$, which has excellent workability, so as to provide electrical insulation between the data wire 120 and the gate wire 140. Alternatively, the interlayer insulating film 130 may have a plurality of layers including an inorganic film made of an inorganic material and an organic film made of an organic material. Since the interlayer insulating film 130 to be described below is formed of $SiN_x$ or $SiO_x$, it is possible to rework an outer lead bonding ("OLB") operation of a gate pad 145 of each gate wire 140 and the data pad 123 of each data wire 120.

The interlayer insulating film 130 protects the organic semiconductor layer 170, because the chemical material or plasma used in a data wire forming process of the data wires 120 may remain on the TFT substrate and flow into the organic semiconductor layer 170 through a gap formed by contact holes 131, 132 and openings 151, 152, 153, 154, as will be further described below, or through an interface between the layers, thereby attacking the organic semiconductor layer 170 which is weak in chemical resistance and plasma resistance. The interlayer insulating film 130 is formed with first and second contact holes 131 and 132 to expose each data line 121 and data pad 123, respectively.

The gate wires 140 are formed mainly on the interlayer insulating film 130. Each gate wire 140 includes a gate line 141 extending in a second direction, where the second direction may be substantially perpendicular to the first direction in which the data line 121 extends. The gate line 141 is thus formed to intersect with the data line 121 and define a pixel region. Each gate wire 140 further includes a gate pad 145 formed at an end of the gate line 141 to receive a driving or controlling signal from an exterior source, a gate electrode 143 formed as a branch of the gate line at a place corresponding to the organic semiconductor layer 170, and conductive members 147, 149 filled in the contact holes 131, 132 and thus overlying the data line and the data pad 123, respectively, and in contact therewith.

The gate pad 145 receives the driving and controlling signal for controlling an ON/OFF action of the respective TFT from an exterior source and transmits the signal through the gate line 141 to the gate electrode 143. The conductive members 147, 149 reduce a contact defect between the transparent electrode layer 160 and the data wire 120, which is caused by a large step difference between the openings 152 and 153 for exposing the data wire 120, because the first gate insulating film 150 is formed as a thick film. A height of the openings 152 and 153 is reduced by the positioning of the conductive members 147, on the data lines 121 and data pads 123. In other words, the conductive members 147, 149 are interposed between the data line 121 and a source electrode 161 and between the data pad 123 and a data pad contacting member 167 so that the step difference is reduced, whereby the source electrode 161 and the data pad contacting member 167 are properly contacted with the data wire 120.

The gate wire 140 may be also formed of at least one of Al, Cr, Mo, Au, Pt, Pd, etc., and have a single layer or a plurality of layers.

The first gate insulating film 150 is formed on the gate wire 140 and exposed portions of the interlayer insulating film 130. The first gate insulating film 150 functions to insulate the data wire 120 from the gate wire 140, and simultaneously prevents impurities from flowing into the organic semiconductor layer 170 which is weak in chemical resistance and plasma resistance. The first gate insulating film 150 may be a relatively thick film containing at least one of acrylic-based resin, polystyrene-based resin and benzocyclobutene which have a low dielectric constant.

The first gate insulating film 150 is formed with the opening 154 for exposing the gate pad 145, the openings 152, 153 for exposing the conductive members 147, 149, as previously described, and the opening 151 for exposing the gate electrode 143.

Preferably, the first gate insulating film 150 of the present invention is formed a material which has excellent durability and a low dielectric constant. Such a material reduces a capacity ($C_{gd}$ or $C_{gs}$) between the source and drain electrodes 161 and 163 and the gate electrode 143, thereby improving the characteristic of the organic TFT. It is preferable that the material has a dielectric constant in the range of 1 to 5.

The second gate insulating film 155 overlies the gate electrode 143 by being formed at the opening 151 within the first gate insulating film 150 that exposes the gate electrode 143. The second gate insulating film 155 has a relatively high dielectric constant in comparison with the first gate insulating film 150. Preferably, it has a dielectric constant in the range of 4 to 15. The second gate insulating film 155 may be formed of at least one of acrylic-based resin, polyvinyl phenolic-based resin, $SiN_x$ or $SiO_x$, and fluoric-based polymer which have a high dielectric constant. Herein, the fluoric-based polymer includes poly tetra fluoro ethylene (PTFE), fluorinated ethylene propylene (FEP), poly fluoro alkoxy (PFA), ethylene tetra fluoro ethylene (ETFE), polyvinylidene fluoride (PVDF), and so on. The first and second gate insulating films 150 and 155 are separately formed so as to maximize the characteristic of the organic TFT by forming an insulating film having a high dielectric constant at a place corresponding to the channel region A. Also, a height (thickness) of the second gate insulating film 155 is lower than a height (thickness) of the first gate insulating film 150 surrounding the second gate insulating film 155, because the second gate insulating film 155 is formed by an inkjet method to be described below.

Thus, the first and second gate insulating films 150 and 155 are separately formed of selected materials according to their functions, respectively, thereby improving the characteristic of the organic TFT.

The transparent electrode layer 160 is formed on the first gate insulating film 150, as well as within openings formed in the first gate insulating film 150. The transparent electrode layer 160 is connected through the contact hole 131 to the data line 121 via the conductive member 147, and includes a source electrode 161 partially contacted with the organic semiconductor layer 170, a drain electrode 163 separated from the source electrode 161 by interposing the second gate insulating film 155 therebetween, and a pixel electrode 165 positioned in the pixel region so as to be connected with the drain electrode 163.

The transparent electrode layer 160 further includes a data pad contacting member 167 connected via the conductive member 149 to the data pad 123, and a gate pad contacting member 169 connected through the opening 154 to the gate pad 145. Because of the conductive members 147, 149, the step difference between the transparent electrode layer 160 and the data line 121, data pad 123, and gate pad 145 may be substantially uniform.

The transparent electrode layer 160 is formed of a transparent conductive material such as, but not limited to, ITO, IZO, etc. The source electrode 161 is physically and electrically connected through the opening 152 to the data line 121, via the conductive member 147, so as to receive an image signal. The drain electrode 163, which is separated from the source electrode 161 by interposing the gate electrode 143 therebetween so as to define a channel region A, forms the TFT along with the source electrode 161, and functions as a switching and driving device for controlling and driving an operation of its associated pixel electrode 165. A matrix of pixels defined by the intersecting gate lines 141 and data lines 121 is thus provided, where each pixel includes the TFT and a pixel electrode 165. Since the source and drain electrodes 161 and 163 are hardly affected by an interfacial characteristic of the second gate insulating film 155, the characteristic of the organic TFT for each pixel is improved. Further, since the pixel electrode 165 and the data wire 120 are not positioned within the same layer, a short between the pixel electrode 165 and the data wire 120 can be avoided.

The organic semiconductor layer 170 is formed in the channel region A. The organic semiconductor layer 170 is partially contacted with the source electrode 161 on one side and drain electrode 163 on an opposing side, while covering the channel region A. Also, a height (thickness) of the organic semiconductor layer 170 is lower than a height (thickness) of the first gate insulating film 150 surrounding the organic semiconductor layer 170, because the organic semiconductor layer 170 is formed by an inkjet method as will be further described below.

The organic semiconductor layer 170 may be formed of pentacene having five benzene rings linked to each other, perylenetetracarboxlic dianhidride (PTCDA), oligothiopene, polythiophene, polythienylenevynylene, etc., and may also be formed of one of the existing organic semiconductor materials.

The first passivation layer 180 is formed on the organic semiconductor layer 170. The first passivation layer 180 covers the organic semiconductor layer 170, and may be an organic film formed of at least one of polyvinyl alcohol (PVA), benzocyclobutene (BCB), acrylic-based resin, silicone polymer and so on. The first passivation layer 180 is provided to prevent the characteristic of the organic semiconductor layer 170 from being deteriorated. Also, a height (thickness) of the first passivation layer 180 is lower than a height (thickness) of the opening 151, because the first passivation layer 180 is formed by an inkjet method as will be further described below.

A second passivation layer 190 may be further formed on the first passivation layer 180. The second passivation layer 190 may be selectively formed, and also functions to prevent the characteristic of the organic semiconductor layer 170 from being deteriorated. The second passivation layer 190 may be formed of the same material as the first passivation layer 180 or may be formed of other material.

Hereinafter, referring to FIGS. 3A to 3H, an exemplary method for manufacturing an exemplary embodiment of a TFT substrate having an organic TFT will be described.

Figure 3A:
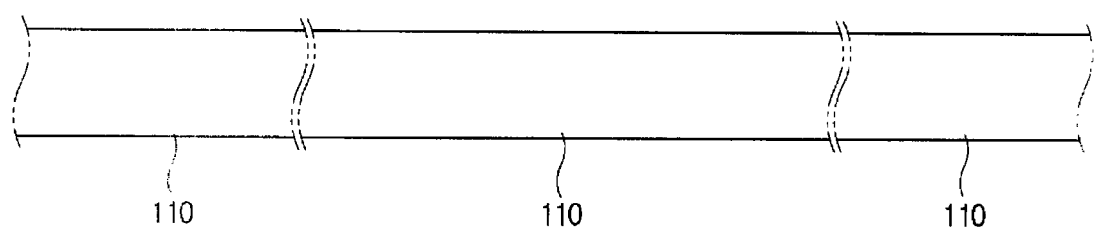
FIGS. 3A, 3B, 3C, 3D, 3E, 3F, 3G, and 3H are cross-sectional views sequentially showing an exemplary method for fabricating the exemplary embodiment of the TFT substrate according to the present invention.

As shown in FIG. 3A, the insulating substrate 110 containing an insulating material such as, but not limited to, glass, quartz, ceramic, plastic, etc., is prepared. Preferably, if a flexible TFT substrate is to be fabricated, then a plastic substrate is used for the insulating substrate 110.

Figure 3B:
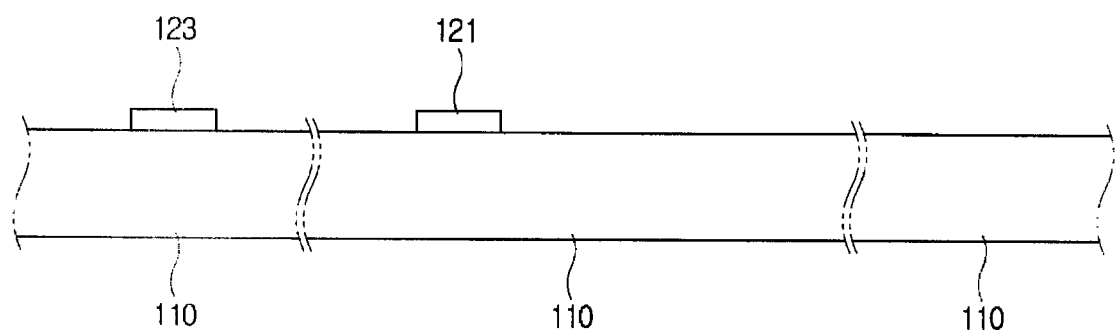

Then, as shown in FIG. 3B, a data wire material (not shown) is deposited on the insulating substrate 110 by using a sputtering method, etc., and then the data line 121 and data pad 123 are formed out of the data wire material by a photolithography process.

Figure 3C:
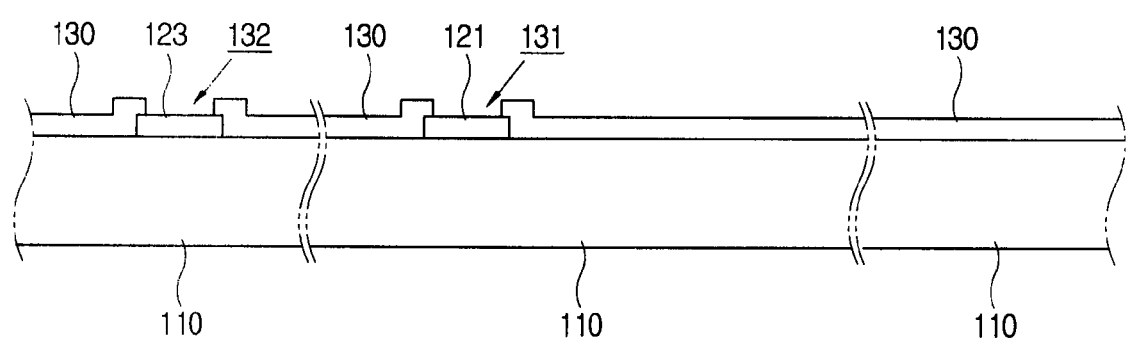

As shown in FIG. 3C, an interlayer insulating material formed of the inorganic material such as $SiN_x$, $SiO_x$, etc., is coated on the insulating substrate 110 and the data wire 120 to form the interlayer insulating film 130. When the interlayer insulating material is an inorganic material, the interlayer insulating film 130 may be formed by a chemical vapor deposition ("CVD") or plasma enhanced chemical vapor deposition ("PE-CVD"). Alternatively, both an organic layer and an inorganic layer may be used as the interlayer insulating film 130. Then, the contact holes 131, 132 for exposing the data wire 120 are formed by an etching process using a photosensitive organic film as a shielding mask.

Figure 3D:
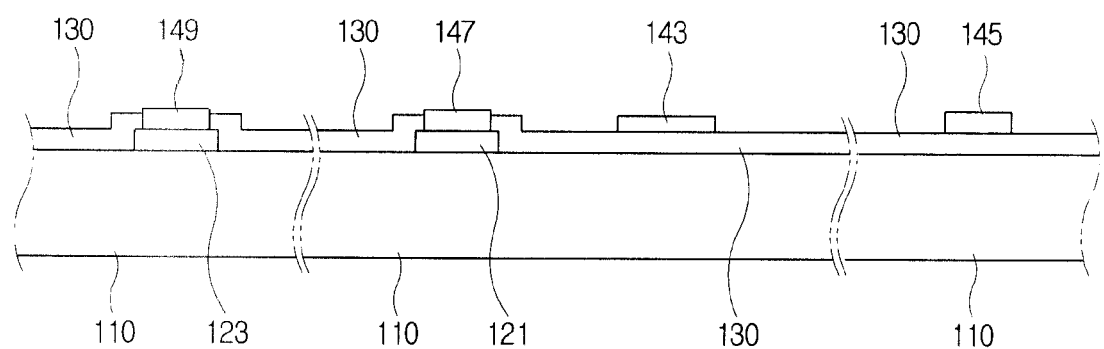

Then, as shown in FIG. 3D, after a gate wire material (not shown) containing at least one of Al, Cr, Mo, Au, Pt, Pd, etc., is deposited on the interlayer insulating film 130 and the data wire 120 within the contact holes 131, 132 by the sputtering method, etc., the gate line 141, the gate electrode 143, the gate pad 145, and the conductive members 147, 149 are formed by the photolithography process.

Figure 3E:
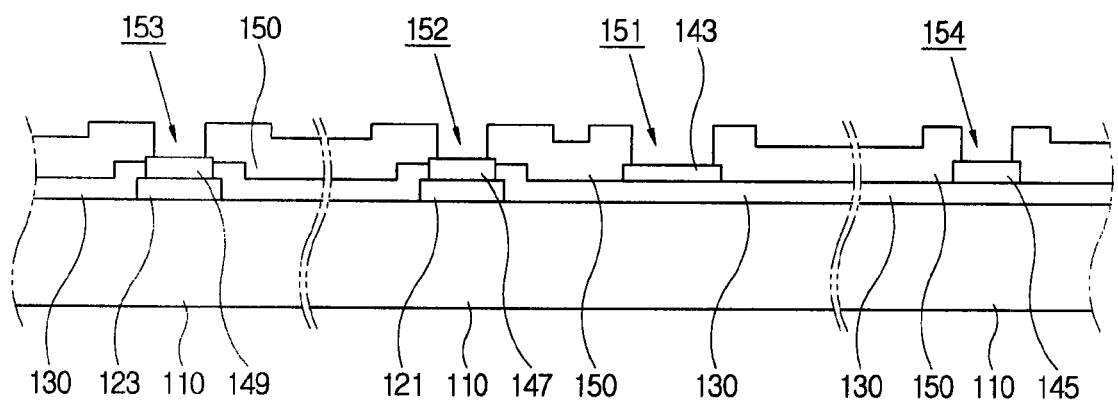

As shown in FIG. 3E, the relatively thick first gate insulating film 150 containing at least one of acrylic-based resin, polystyrene-based resin, and benzocyclobutene which have a low dielectric constant is formed on the gate wire 140 and the interlayer insulating film 130. The first gate insulating film 150 may be formed by a spin coating or slit coating method. The openings 151, 152, 153, and 154 are formed through the first gate insulating film 150 by an etching process using the photosensitive film and the like as the shielding mask.

Figure 3F:
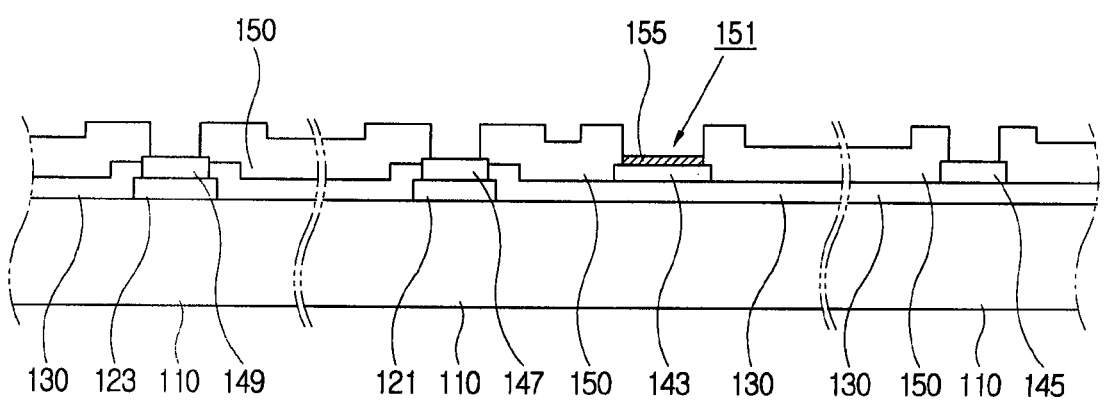

As shown in FIG. 3F, the second gate insulating film 155 is formed on the portion of the gate electrode 143 exposed through the opening 151 by applying a second gate insulating material using an inkjet method. The second gate insulating film 155 may contain at least one out of acrylic-based resin, polyvinyl phenolic-based resin, $SiN_x$ or $SiO_x$, and fluoric-based polymer which have a high dielectric constant relative to the material used for the first gate insulating film 150.

Figure 3G:
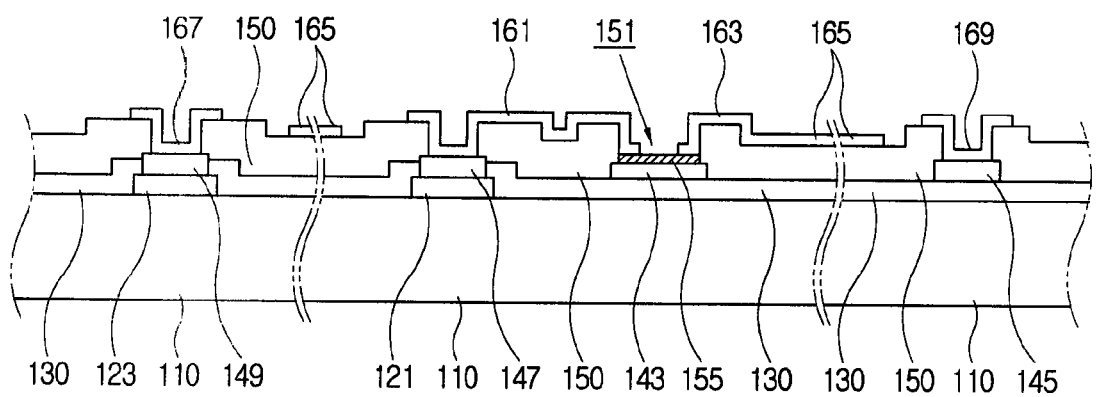

As shown in FIG. 3G, a transparent conductive metallic oxide material (transparent conductive material) such as, but not limited to, ITO or IZO is coated on the first gate insulating film 150 by the sputtering method, and then the transparent electrode layer 160 is formed by using the photolithography process or the etching process. The transparent electrode layer 160 for each pixel includes the source electrode 161 which is connected through the opening 152 to the data line 121 via the conductive member 147 and at least partially contacted with the organic semiconductor layer 170 through the opening 151 above the gate electrode 143. The transparent electrode layer 160 for each pixel also includes the drain electrode 163 which is separated from the source electrode 161 by interposing the organic semiconductor layer 170 therebetween so as to define the channel region A. The transparent electrode layer 160 for each pixel further includes a pixel electrode 165 positioned in the pixel region of each pixel so as to be connected with the drain electrode 163. The transparent electrode layer 160 further includes the data pad contacting member 167 connected through the opening 153 to the data pad 123 at the end of each data line 121 and the gate pad contacting member 169 connected through the opening 154 to the gate pad 145 at the end of each gate line 141.

Figure 3H:
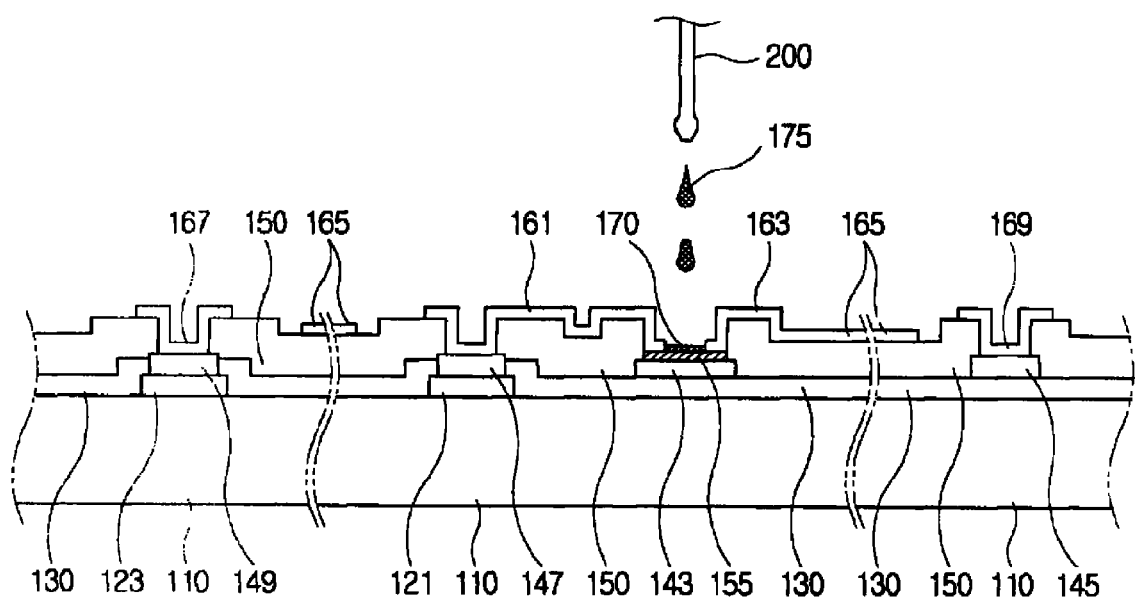

Then, as shown in FIG. 3H, an organic semiconductor material 175 is jetted through a nozzle 200 on the channel region A. The organic semiconductor material may be aqueous or oleaginous depending on a solvent to be used. The organic semiconductor material 175 is treated by a solvent removing process to form the organic semiconductor layer 170. Since the inkjet method can pattern the organic semiconductor material 175 without a patterning process of the conventional photolithographic method, the organic semiconductor layer 170 is free from a chemical material used in the photolithographic method, thereby reducing deterioration of the characteristic of the organic TFT.

Although not shown, a first passivation layer solution is jetted on the completed organic semiconductor layer 170 to form the first passivation layer 180. The first passivation layer solution may be aqueous or oleaginous depending on a solvent to be used. The first passivation layer solution is treated by a solvent removing process to form the first passivation layer 180. The first passivation layer 180 has a flat surface.

A second passivation layer material formed of, by example only, Polyvinyl Alcohol (PVA), Benzocyclobutene (BCB), etc., may be coated on the first passivation layer 180 so as to form the second passivation layer 190. The second passivation layer 190 may be formed by the spin coating or slit coating method. While the second passivation layer 190 is shown disposed generally over the opening 151, the second passivation layer 190 may alternatively be formed to cover an area of the TFT substrate extending from the opening 152 to the channel region A. This process may be selectively applied.

As shown in FIG. 2, the organic TFT is fabricated by the above-described process. A TFT substrate including the organic TFT as described above may be employed in such devices as a liquid crystal display ("LCD") device, an organic electroluminescent display device, or an inorganic electroluminescent display device.

Unlike a conventional fabricating method, in the exemplary method for fabricating the exemplary embodiment of the TFT substrate according to the present invention, since the second gate insulating film 155, the organic semiconductor layer 170, and the first passivation film 180 are formed by the inkjet method, the fabricating process is relatively simple in comparison with the conventional method. Furthermore, since, after forming the organic semiconductor layer 170, the process using the plasma or the chemical material is omitted, it is possible to reduce the deterioration of the characteristic of the organic semiconductor layer 170.

As described above, the present invention provides a TFT substrate in which the characteristic of the organic TFT is improved by reducing deterioration of the organic semiconductor layer 170.

Further, the present invention provides an exemplary method for fabricating the exemplary embodiments of the TFT substrate in which fabricating processes are simply improved.

Although a few exemplary embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A method for fabricating a thin film transistor substrate, comprising:
preparing an insulating substrate;
forming a gate electrode on the insulating substrate;
forming a data wire between the insulating substrate and the gate electrode but not overlapped by the gate electrode;
forming a first gate insulating film, having a low dielectric constant;
forming an opening in the first gate insulating film exposing at least part of the gate electrode;
forming a second gate insulating film having a larger dielectric constant than the first gate insulating film in the opening;
forming a source electrode and a drain electrode disposed apart from each other in a central area of the second gate insulating film to define a channel region there between; and
forming an organic semiconductor layer in the channel region.

2. The method according to claim 1, further comprising forming an interlayer insulating film, having a contact hole exposing at least part of the data wire, on the data wire and the insulating substrate.

3. The method according to claim 2, further comprising forming a conductive member in the contact hole when forming the gate electrode.

4. The method according to claim 3, wherein forming the second gate insulating film includes employing an inkjet method.

5. The method according to claim 3, further comprising forming a gate pad while forming the conductive member,
forming an additional opening in the first gate insulating film, exposing at least part of the gate pad, and
forming a data pad contacting member connected through the contact hole to the conductive member, and a gate pad contacting member connected through the additional opening to the gate pad, while forming the source and drain electrodes.

6. The method according to claim 1, wherein forming the organic semiconductor layer includes employing an inkjet method.

7. The method according to claim 1, further comprising forming a first passivation layer in the channel region and on the organic semiconductor layer.

8. The method according to claim 7, wherein forming the first passivation layer includes employing an inkjet method.

9. The method according to claim 1, wherein forming the second gate insulating film includes forming the second gate insulating film with a smaller thickness than a thickness of the first gate insulating film.

* * * * *